United States Patent [19]

Joy et al.

[11] 4,200,555
[45] Apr. 29, 1980

[54] LOW WORK FUNCTION HEXABORIDE ELECTRON SOURCE

[75] Inventors: David C. Joy, Warren; Paul H. Schmidt, Chatham, both of N.J.

[73] Assignee: Bell Telephone Laboratories, Incorporated, Murray Hill, N.J.

[21] Appl. No.: 928,528

[22] Filed: Jul. 27, 1978

[51] Int. Cl.$^2$ ............................................. H01B 1/06
[52] U.S. Cl. .................................. 252/521; 313/336; 313/346 R
[58] Field of Search .................... 252/521; 313/346 R, 313/336

[56] References Cited

U.S. PATENT DOCUMENTS

| 3,932,314 | 1/1976 | Kawabe et al. | 252/521 |
| 4,054,946 | 10/1977 | Ferris et al. | 313/346 R |

FOREIGN PATENT DOCUMENTS 1232523  5/1971  United Kingdom.

OTHER PUBLICATIONS

Chemical Abstracts, vol. 88, (1978), Abst. No. 15022z, "Material for Thermoelectronic Cathodes," Bilyk, I. I. et al.

Journal of Applied Physics, vol. 13, (1974), No. 2, "Single Crystal Growth of Lanthanum Hexaboride in Molten Aluminium," p. 391.

Journal of Applied Physics, vol. 22, No. 3, (1951), "Boride Cathodes," pp. 299–309.

The Review of Scientific Instruments, vol. 40, No. 8, (1968), "A New High Resolution Reflection Scanning Electron Microscope," pp. 1040–1045.

Journal of Applied Chemistry, vol. 37, (1964), "Preparation of the Double Boride of Lanthanum and Sodium and Study of Some, etc.," pp. 1861–1866.

Primary Examiner—E. Suzanne Parr
Attorney, Agent, or Firm—Richard D. Laumann

[57] ABSTRACT

An electron source using an electron emissive material having a composition represented by the nominal atom formula $La_x(Nd_yPr_{1-y})_{1-x}B_6$; x less than 0.5 and greater than 0.2, y less than or equal to 1.0 and greater than or equal to 0.0, is described. The electron source is well suited for use in instruments such as scanning electron microscopes and electron beam exposure systems.

7 Claims, 1 Drawing Figure

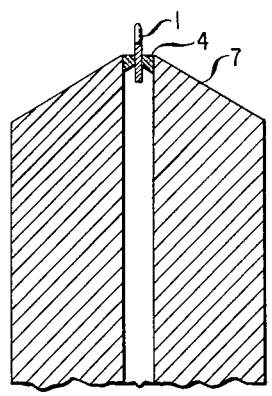

LOW WORK FUNCTION HEXABORIDE ELECTRON SOURCE

BACKGROUND OF THE INVENTION

1. Field of the Invention

This invention relates generally to electron emissive materials and more particularly to mixed rare earth hexaborides.

2. Description of the Prior Art

Many modern instruments, such as scanning electron microscopes, electron beam exposure systems, cathode ray tubes and magnetrons used in radar require high intensity electron beams. These beams must often be both small and dimensionally stable. The material that is the source of an electron beam with these properties should have a high melting temperature, low vapor pressure, chemical stability at elevated temperatures as well as a low work function and a large value for the coefficient, A, in the Richardson-Dushman equation. The electron emissive material used to generate electron beams has generally been tungsten or thoriated tungsten. While perfectly satisfactory for many purposes, the high temperatures, normally about 2500 degrees C., required for satisfactory current densities lead to dimensional instabilities of the electron beam and shortened emitter lifetimes which are commercially undesirable.

Much effort has been spent looking for electron emissive materials having properties superior to those of tungsten and thoriated tungsten electron sources. Lafferty's work, *Journal of Applied Physics* 22, 299 (1951), demonstrated that single rare earth hexaborides are attractive candidates because of their relatively low work functions and generally high melting temperatures. Of the single rare earth hexaborides, lanthanum hexaboride, $LaB_6$, has emerged as the most attractive electron emissive material. As shown by Broers, *Reviews of Scientific Instruments* 40, 1040 (1968), and Ferris et al U.S. Pat. No. 4,054,946, $LaB_6$ has a long lifetime, a high melting temperature, a low work function and is chemically stable at the elevated temperatures necessary for thermionic emission.

The properties of the single rare earth hexaboride systems have prompted work to find better materials in other hexaboride systems. One direction that has been taken is the investigation of rare earth hexaborides that are doped or mixed with other materials or compounds. Several mixed hexaboride systems have been investigated and include $(NaLa)B_6$ *Journal of Applied Chemistry* 37, 1861 (1964); solid solutions of $LaB_6$ and an isomorphous alkaline earth hexaboride such as $BaB_6$ or $SrB_6$, United Kingdom Pat. No. 1,232,523; and $(Y_{1-x}Eu_x)B_6$, $0 < x < 1$, U.S. Pat. No. 3,932,314. While promising, these approaches have not been completely successful. Long term chemical or physical stability of these systems is not assured because one component, e.g., Na, is relatively volatile or surface conversion of one hexaboride system to another system, e.g., $YB_6$ to $YB_4$, is possible.

SUMMARY OF THE INVENTION

An electron source comprises an electron emissive material consisting of the mixed rare earth hexaborides $La(Nd,Pr)B_6$ or $Ce(Nd,Pr)B_6$. In a preferred embodiment the electron emissive material consists of the composition represented by the nominal atom formula $La_x(Nd_yPr_{1-y})_{1-x}B_6$; x less than 0.5 and greater than 0.2; y less than or equal to 1.0 and greater than or equal to 0.0.

BRIEF DESCRIPTION OF THE DRAWING

The FIGURE is a cross-sectional view of the electron source comprising electron emissive material and its mounting structure.

DETAILED DESCRIPTION

The invention resides in the observation that substitution of La or Ce atoms for some of the rare earth atoms in $(Nd,Pr)B_6$ results in an electron emissive composition having properties equal to or superior to those of $LaB_6$. The La or Ce atoms desirably substitute for 20 percent to 50 percent of the total number Nd and Pr atoms. Below 20 percent substitution, either the temperature of the composition must be increased significantly to obtain electron beam currents comparable to those obtained within the preferred range or the electron current decreases. Above 50 percent substitution, the probabilities that either two phases will be present or that the emission will be unstable greatly increase. The compositions having the substituted atoms form low work function hexaborides which have high melting temperatures and little tendency for surface conversion to systems other than the hexaboride. In a preferred embodiment, the electron source uses the electron emissive composition represented by the nominal atom composition $La_x(Nd_yPr_{1-y})_{1-x}B_6$; x less than 0.5 and greater than 0.2, y less than or equal to 1.0 and greater than or equal to 0.0. In an especially preferred embodiment, x is approximately 0.3.

The electron emissive materials may be either single crystal or polycrystalline. Electron sources using single crystal electron emissive material have been found to produce a more stable electron beam than sources using polycrystalline material. The compositions may be prepared by any conventional and well-known crystal growing technique such as arc melting, Czochralski growth, arc zone melting, or a flux technique. A suitable flux growth technique is outlined in *Japanese Journal of Applied Physics* 13, p. 391 (1974) and discussed in detail in U.S. Pat. No. 4,054,946.

Starting materials are boron of typically greater than 99.999 percent purity and rare earths of typically greater than 99.9 percent purity. For the aluminum flux growth, the aluminum is typically greater than 99.99 percent pure. Purities as low as 99 percent for boron, 99.5 percent for the rare earths and 98 percent for Al may be used without seriously degrading the electron emission properties.

The crystals are desirably used without being mechanically shaped to avoid the possibility of introducing crystal defects which might impair electron emission. However, reduction of the effective size of the emitter by electrolytically shaping the crystal tip has been found desirable. Electrolytic shaping is conveniently accomplished with an electrolyte composed of approximately 80 percent $H_2O$ and approximately 20 percent HCl. The electrolyte is at room temperature and, using any nonreactive metal, a DC potential of approximately 20 volts is applied. Adequate shaping is obtained in approximately ten seconds.

The electron emissive materials described are useful as thermionic emitters over the approximate temperature range extending from 1050 degrees C. to 1600 degrees C. The interval between 1200 degrees C. and 1500 degrees C. has been found optimum. Below 1050 degrees C., electron emission is too low to yield useful current densities and above 1600 degrees C., sublimation from the crystal will significantly reduce emitter lifetime. Below 1200 degrees C., the tip may not be completely activated and emission may be unstable. Above 1500 degrees C., the rate at which emitter brightness increases with temperature decreases.

Activation temperatures are approximately 1200 degrees C. although an adequate current density may be maintained if the operating temperature is reduced after activation. The high activation temperature probably causes removal of electron emission inhibiting contaminants from the emitter surface.

The electron emitter typically operates at a pressure less than $10^{-6}$ Torr. Greater pressures reduce emitter lifetime because of chemical reactions between residual gas and the electron emissive material. For example, oxygen may react with boron to cause formation of $B_2O_3$ which has a high vapor pressure and readily vaporizes or with a rare earth to form an oxide that is thermally difficult to remove and which will degrade emission properties. At pressures greater than $10^{-5}$ Torr, arcing between the crystal tip and the anode may occur and reduce emitter lifetime by removing emitter material and changing the emitter tip shape.

A suitable mounting structure for supporting the electron emissive material is depicted in the FIG. Electron emissive material 1 is held between two pieces of vitreous carbon 4 which, in turn, are supported by molybdenum jaws 7. The relatively high thermal conductivity of molybdenum improves dimensional stability by decreasing thermal expansion of the jaws. Materials, such as tantalum, that have thermal properties similar to molybenum may be used instead of molybdenum. For the resistively heated crystal shown, vitreous carbon is preferred to pyrolytic carbon because its poorer thermal conductivity permits reaching the desired operating temperature with a smaller current.

Measurements of the electron current from electron emissive materials prepared and mounted as described were made in an ion pumped vacuum chamber at a pressure of approximately $5 \times 10^{-7}$ Torr. The measuring apparatus included a standard Faraday cup electron collector and picoammeter, and a tantalum accelerating anode plate having a 1.0 mm aperture. Deflector plates mounted between the anode and the Faraday cup aided beam alignment. The electron currents were measured in units of a tungsten emitter operating at 2400 degrees C. and assigned an electron current of 1 unit. An $LaB_6$ single crystal oriented to emit perpendicular to the <110> crystal face and operating between 1100 degrees C. and 1500 degrees C. produced an electron current of 100 units.

EXAMPLE 1

Polycrystalline $La_{0.3}Pr_{0.7}B_6$ was prepared and mounted as described. In the temperature range extending from 1000 degrees C. to 1350 degrees C., the electron current was slightly in excess of 100 units.

EXAMPLE 2

Polycrystalline $La_{0.3}Nd_{0.7}B_6$ was prepared and mounted as described. In the temperature range extending from 1000 degrees C. to 1500 degrees C., the electron current was 250 units.

EXAMPLE 3

Single crystal $La_{0.3}Nd_{0.7}B_6$ was prepared as described and mounted to permit measurement of the current emitted perpendicular to the <110> crystal face. In the temperature range extending from 1000 degrees C. to 1500 degrees C., the electron current was 250 units.

We claim:

1. An electron source comprising an electron emissive material and a mounting structure, said structure supporting said electron emissive material, characterized in that said electron emissive material consists of a composition represented by the nominal atom formula $(Z_x)(Nd_yPr_{1-y})_{1-x}B_6$; x less than 0.5 and greater than or equal to 0.2, y less than or equal to 1.0 and greater than or equal to 0.0, and Z selected from the group consisting of La and Ce.

2. An electron source as recited in claim 1 in which Z is La.

3. An electron source as recited in claim 2 in which x is approximately 0.3.

4. An electron source as recited in claim 3 in which y is approximately 1.0.

5. An electron source as recited in claim 3 in which y is approximately 0.0.

6. An electron source as recited in claim 3 in which said mounting structure comprises vitreous carbon pieces, said pieces holding said electron emissive material.

7. An electron source as recited in claim 6 in which said mounting structure further comprises molybdenum jaws, said jaws supporting said vitreous carbon pieces.

* * * * *